United States Patent [19]

Jenq et al.

[11] Patent Number: 5,721,152
[45] Date of Patent: Feb. 24, 1998

[54] METHOD OF FABRICATING A STACKED CAPACITOR FOR A DRAM CELL BY PLASMA ETCHING

[75] Inventors: J.S. Jason Jenq, Pingtung; Gary Hong, Hsin-Chu, both of Taiwan

[73] Assignee: United Microelectronics Corporation, Hsin-Chu, Taiwan

[21] Appl. No.: 766,783

[22] Filed: Dec. 13, 1996

Related U.S. Application Data

[60] Provisional application No. 60/012,119, Feb. 15, 1996.

[51] Int. Cl.⁶ .................................................... H01L 2/8242
[52] U.S. Cl. ........................... 437/52; 437/60; 437/919
[58] Field of Search ........................ 437/47, 52, 60, 437/919

[56] References Cited

U.S. PATENT DOCUMENTS

| | | | |
|---|---|---|---|
| 5,286,668 | 2/1994 | Chou | 437/52 |
| 5,374,577 | 12/1994 | Tuan | 437/52 |
| 5,385,859 | 1/1995 | Enomoto | 437/52 |
| 5,525,534 | 6/1996 | Ikemasu et al. | 437/60 |
| 5,622,882 | 4/1997 | Yee | 438/210 |
| 5,637,523 | 6/1997 | Fazan et al. | 438/297 |

OTHER PUBLICATIONS

T. Ema, et al., "3D Stacked Capacitor—Cell for 16M DRAMs," IEDM pp. 592–595 (1988).

*Primary Examiner*—Jey Tsai
*Attorney, Agent, or Firm*—William H. Wright

[57] ABSTRACT

A DRAM memory capacitor is formed by depositing a layer of polysilicon on FOX and device areas. Form gate structures and S/D structures by etching through the oxide layer, so openings extend over a portion of the polysilicon layer of the gate structure and the FOX areas. Capacitor plates are formed next. Deposit a first plate into electrical and mechanical contact with one of the S/D structures and dope the first capacitor plate to a high level. Deposit a second plate doped to a low level, a third plate doped to a high level, and a fourth plate doped to a low level. Pattern the plates by etching so the remaining portions lie over planned capacitor areas, with the remainder removed by selective isotropic etching away of portions of the plates doped to a high level to provide fins by removal thereof from between plates doped to a low level. Remove by selective isotropic etching portions of the first plate and the third plate to create an undercut of the second and fourth plates to create fins of the second and fourth plates.

13 Claims, 7 Drawing Sheets

METHOD OF FABRICATING A STACKED CAPACITOR FOR A DRAM CELL BY PLASMA ETCHING

This application claims priority from provisional application Ser. No. 60/012,119, filed Feb. 15, 1996.

BACKGROUND OF THE INVENTION

1. Field of the Invention

This invention relates to the fabrication of integrated circuit (IC) semiconductor devices and more particularly to high density dynamic random access memory (DRAM) devices and the like, with particular emphasis upon multilayer capacitor structures in integrated circuit devices and methods of manufacture thereof.

2. Description of Related Art

As DRAMs become smaller and smaller in footprint, manufacture of the needed capacitance per unit area becomes more difficult. To construct high density DRAMs in a small chip area, cell structures have changed from planar-type capacitors to either trench capacitors or stack capacitors. Approaches to increasing capacitance fall into two categories. The first category of approaches includes thinning the capacitor dielectric and/or using higher dielectric constant films, e.g., oxide-nitride-oxide (ONO) composite films or tantalum pentoxide. Implementation of these approaches has not been entirely successful to date, due to continuing leakage and reliability problems.

The second category of approach includes building three dimensional capacitor structures to increase the capacitor area without increasing the planar area of the capacitor by means such as trench capacitors and stacked capacitors. For a given dielectric film in such a DRAM capacitor, the larger the surface area of the storage electrodes, the higher the capacitance. With trench capacitors, as the DRAM density increases, the trench must be very deep which conflicts with technological and theoretical processing limitations in forming the deep trenches. When the stacked capacitor approach is used to fabricate high density DRAMs, very complicated stacked structures are needed, such as fin structures, crown structures, etc. Such structures require expensive manufacturing processes which reduce yields.

The fin structure of a DRAM cell is typically formed by a process requiring wet etching as shown in T. Ema et al., "3D Stacked Capacitor - Cell for 16M and 64M DRAMs" IEDM pp. 592–595 (1988).

U.S. Pat. No. 5,286,668 of Chou for "Process of Fabricating a High Capacitance Storage Node" shows a method of forming a stacked DRAM capacitor with hot phosphoric acid.

U.S. Pat. No. 5,374,577 of Tuan for "Polysilicon Undercut Process for Stack DRAM" and U.S. Pat. No. 5,385,859 of Enomoto for "Method for Fabricating a Semiconductor Device Having a Capacitor with a Conductive Plug Structure in a Stacked Memory Cell" show the formation of a fin-type stacked structure.

There is a need to eliminate the use of hot phosphoric acid etching doped polysilicon because of the problem of fin structure drifting and cost caused by use of hot phosphoric acid.

SUMMARY OF THE PREFERRED EMBODIMENTS

There is a need for a dry process such as plasma etching of doped polysilicon which eliminates the problem of fin structure drifting caused by a hot phosphoric acid process and which provides a new method of fabricating dynamic random access memory (DRAM) cell capacitors which have a larger electrode plate to increase the capacitance.

Embodiments of this invention form polysilicon fins by a process employing a series of steps including the by plasma etching of material between polysilicon fins, in a way which reduces the cost and cycle time of the manufacturing process.

In accordance with this invention, a dynamic random access memory having a capacitor and a method of manufacture thereof is provided. Preferred embodiments of the present invention include some or all of the steps summarized below in various combinations.

Field oxide or other device isolation structures are formed on the surface of a semiconductor substrate, leaving device areas for fabricating field effect devices having gate structures and source/drain structures. Form a gate dielectric layer on the substrate in the device areas and deposit a first layer of polysilicon on the field oxide areas and the device areas. Remove portions of the first polysilicon layer while leaving portions thereof for the gate structure in the device areas, and portions over the field oxide areas. Then form the source/drain structures within the device areas of the semiconductor substrate associated with the gate structures. Form a first oxide layer over the device and field oxide areas.

Form capacitors for the memory by first etching openings to the source/drain structures through the first oxide layer. Deposit a first capacitor plate polysilicon layer having a thickness of between 500Å and about 1500Å over the device and field oxide areas and in contact with one of the source/drain structures. Dope the first capacitor plate layer by ion implantation with ions of arsenic (As), applied at an energy of about 60 keV to a concentration between about 5 E 15 ions/cm$^2$ and about 5 E 16 ions/cm$^2$ resulting in a high doping polysilicon doped to a relatively high level greater than about 5 E 20 atoms/cm$^2$. Deposit a second capacitor plate polysilicon layer having a thickness of approximately 500Å over the first capacitor plate layer and dope the second capacitor plate layer by ion implantation with ions of arsenic (As), at an energy of about 60 keV to a concentration between about 1 E 14 ions/cm$^2$ and about 1 E 15 ions/cm$^2$ resulting in a low doping polysilicon doped to a relatively low level less than about 1 E 20 atoms/cm$^3$. Deposit a third capacitor plate polysilicon layer having a thickness of between 500Å and about 1500Å over the second layer and dope the third capacitor plate layer by ion implantation with ions of arsenic (As), at an energy of about 60 keV to a concentration between about 5 E 15 ions/cm$^2$ and about 5 E 16 ions/cm$^2$ resulting in a high doping polysilicon doped to a relatively high level greater than about 5 E 20 atoms/cm$^3$. Deposit a fourth capacitor plate polysilicon 55 layer having a thickness of between 500Å and about 1500Å over the third layer and dope the fourth capacitor plate layer by ion implantation with ions of arsenic (As), at an energy of about 60 keV to a concentration between about 1 E 14 ions/cm$^2$ and about 1 E 15 ions/cm$^2$ resulting in a low doping polysilicon doped to a relatively low level less than about 1 E 20 atoms/cm$^3$.

Etch anisotropically to pattern the first, second, third and fourth capacitor plate polysilicon layers so that the remaining portions lie over planned capacitor areas, including over portions of the gate structure and over portions of the field oxide areas. The other portions of the first to fourth polysilicon layers are removed by selective etching with a plasma, isotropically etching away portions of the capacitor plate layers doped to a relatively high level greater than about 5 E 20 atoms/cm³. This etching process provides fins by removing the highly doped polysilicon from between capacitor plate layers doped to a relatively low level less than about 1 E 20 atoms/cm³. Preferably, this selective isotropic etching process removes portions of the first capacitor plate polysilicon layer and the third capacitor plate polysilicon layer to create an undercut of the second and fourth capacitor plate polysilicon layers to create fins of the second and fourth capacitor plate polysilicon layers. For example, the selectivity of etching the layers doped to a relatively high level versus the layer doped to a relatively low level is most preferably greater than about 5 to 10.

The method continues by forming a capacitor dielectric layer over the capacitor plate layers. Deposit an additional polysilicon layer, over and extending between the fins, as the top plate electrode. Pattern the additional polysilicon layer and the dielectric layer to complete the capacitor. The capacitor plate layer etching may be performed in a three step process of main etching and overetching and flushing with the parameters as follows:

M. E. (main etching): 70 sccm Cl₂, 80 mTorr;

O.E. (overetching): 70 sccm Cl₂, 80 mTorr; and

Flush: 35 sccm Cl₂, 70 sccm SF₆, 220 mTorr.

The via etching may be performed under etching conditions as follows:

30 sccm CHF₃, 30 sccm methane (CF₄) gas;

250 seem argon (Ar) gas, 230 mTorr; and at an energy of 800 Watts.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

Figure 1:
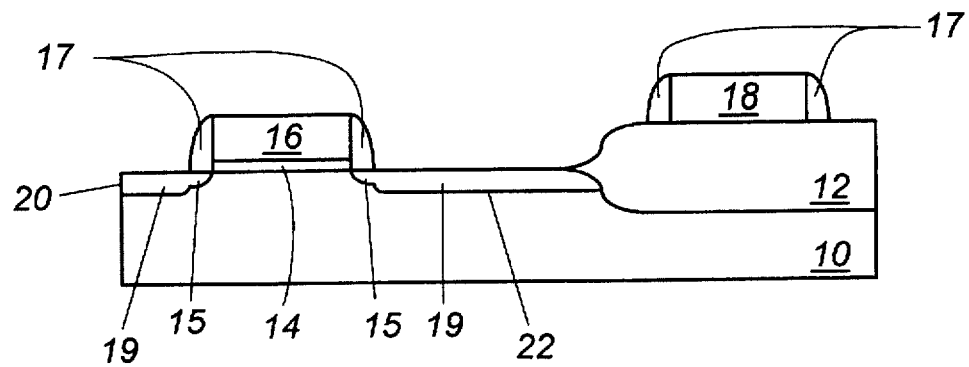
FIG. 1 illustrates an initial stage in the manufacture of a DRAM structure upon which a new capacitor structure will be fabricated.

FIG. 1 illustrates the initial stages of manufacture of a DRAM through which the methods and structures of this invention are explained. A DRAM device in an early stage of manufacture is shown with a field oxide (FOX) region 12 formed on the surface of P-doped silicon substrate 10 by conventional processes. It should be noted that, while a LOCOS-type field oxide region is illustrated herein, other conventional device isolation structures including shallow trench isolation may alternatively be used. A polysilicon gate electrode 16 is provided on the gate oxide layer 14. The FIG. 1 structure can be formed as follows. The surface of the silicon substrate 10 is thermally oxidized to form a gate oxide layer 14 having a preferred thickness between about 50Å to 200Å. Next, a first polysilicon layer is blanket deposited by LPCVD (Low Pressure Chemical Vapor Deposition) to a preferred thickness of between about 1000Å and about 4000Å. The first polysilicon layer can be doped by various methods. One method includes ion implanting with phosphorous or arsenic ions with a dose of between 5 E 15 ions/cm² and 10 E 15 ions/cm² at an energy of between 20 keV and 60 keV. Alternatively, the polysilicon layer is doped by diffusion from phosphorus oxychloride at a temperature of about 900° C. A photoresist mask having openings over regions to be etched is formed and anisotropic etching is performed to form transfer FET gate electrode 16 over the oxide layer 14 and polysilicon wiring lines 18 above the field oxide region 12.

The source/drain structures of the MOS FET are formed in the conventional fashion. Of course, it is well understood by those smiled in the art that a P channel FET integrated circuit device could be formed by simply substituting opposite doping types in place of those employed in the N channel embodiment shown. Donor dopant ions are implanted self-aligned to the gate electrode to form N- lightly doped drain regions 15 in the portions of substrate 10 not covered by gate electrode 16. The field oxide regions 12 mask the portion of substrate 10 covered by the field oxide regions. Lithographic masks (not shown) of, for example, photoresist may be required to protect the areas not to be subjected to any particular ion implantation in this and other implantation steps used in the manufacture of the device. The N- lightly doped drain implantation 15 is done with, for example, phosphorous $P^{31}$ at a dose of between 1 E 13 atoms/cm$^2$ and 1 E 14 atoms/cm$^2$ and with an energy of between about 30 keV and about 80 keV.

Dielectric spacers are formed on either side of the gate electrodes 16 and wiring lines 18. A low temperature silicon oxide layer is deposited using a technique such as chemical vapor deposition using, for example, a tetraethylorthosilane (TEOS) source gas at a temperature in the range of between about 650° C. and about 900° C. is used to deposit a blanket oxide layer. Other silicon oxide deposition methods include silane based LPCVD. The thickness of the dielectric silicon oxide layer deposited is between about 1000Å and 4000Å, and preferably about 2,500Å. Dielectric spacers 17 are then formed by anisotropic etching. N+ source/drain regions are formed by ion implantation using, for example, arsenic ($As^{75}$) ions implanted to a dose of between about 2 E 15 ions/cm$^2$ and about 1 E 16 ions/cm$^2$ at an energy of between about 20 keV and about 100 keV to form more heavily doped portion 19 of the source/drain regions 20/22 of the N channel lightly doped drain (LDD) MOS FET integrated circuit device shown in FIG. 1. This FET serves as the transfer FET controlling access to the charge storage capacitor of the DRAM memory cell.

Figure 2:
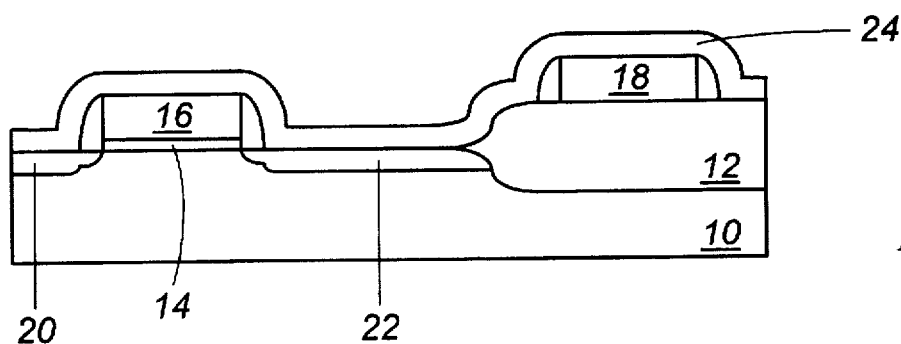
FIG. 2 shows the device of FIG. 1 after a first thin silicon oxide (or the like) dielectric layer has been formed upon the control gate and conductor structure as well as the spacers and the exposed monocrystalline silicon substrate regions including source/drain regions.
Figure 3:
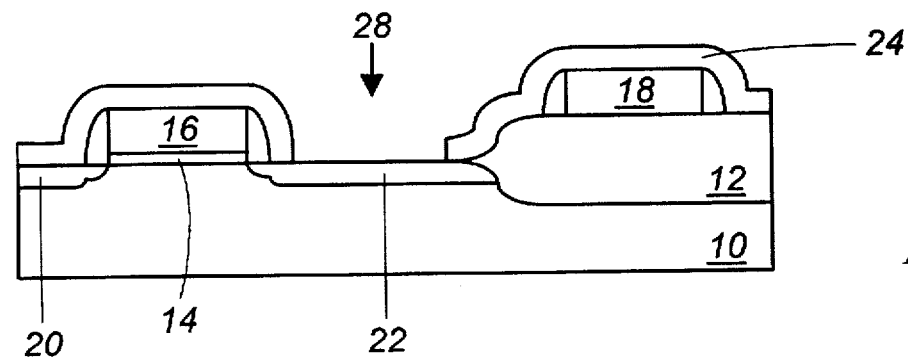
FIG. 3 shows the device of FIG. 2 with via in the dielectric layer to one terminal of the capacitor being formed.

Referring to FIG. 2, the device of FIG. 1 is shown after a first thin silicon oxide or similar dielectric layer 24 has been formed over the control gate 16 and wiring (conductor) structure 18, source/drain regions 20/22. Preferred conditions for forming the dielectric layer 24 are LPCVD deposition from TEOS source gas or silane based CVD silicon oxide deposition at a substrate temperature of about 600° C. to 900° C. The preferred thickness of dielectric layer 20 is between about 500 to 2500Å and a preferred thickness is about 1500Å. FIG. 3 shows the device of FIG. 2 with an opening 28 formed through the dielectric layer 24, exposing source/drain region 22 within the opening 28. Source/drain region 22 acts as a terminal connecting the transfer FET to the capacitor being formed. A photoresist mask is formed on the dielectric layer 24, exposing the oxide layer 24 over the source/drain region 22. Layer 24 is etched to form the opening 28 to source/drain region 22, for example, using a machine such as a TEL-5000 reactive ion etcher, with the etching conditions of 30 sccm $CHF_3$, 30 sccm methane ($CF_4$) gas, 250 sccm argon (Ar) gas, 230 mTorr pressure and an energy of 800 watts.

Figure 4:
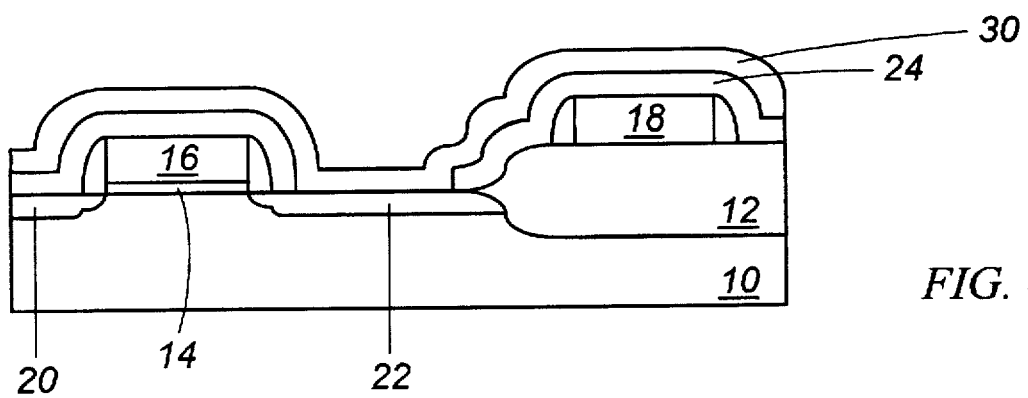
FIG. 4 shows the device of FIG. 3 after deposition of a first polysilicon layer for the capacitor electrode over the previous oxide layer.

Referring to FIG. 4, the device of FIG. 3 is shown after deposition of a blanket layer 30 to form the primary capacitor plate polysilicon layer 30 (polysilicon 1, having a thickness of between 500Å and about 1500Å) over the previous oxide layer 24 and in contact with the source/drain region 22. Polysilicon layer 30 is doped by ion implanting arsenic (As) ions at an energy of about 50 keV to a concentration of between about 5 E 15 ions/cm$^2$ and about 5 E 16 ions/cm$^2$ resulting in a highly doped polysilicon layer with a dopant concentration of between about 5 E 20 atoms/cm$^3$ and about 5 E 21 atoms/cm$^3$.

Figure 5:
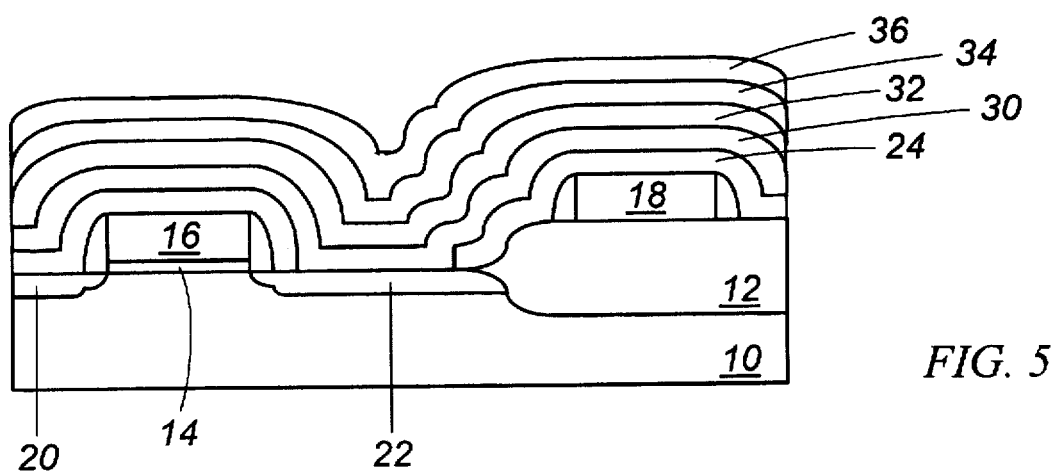
FIG. 5 shows the device of FIG. 4 after deposition of a total of four capacitor plate layers in the capacitor electrode structure.

FIG. 5 shows the device of FIG. 4 after additional polysilicon layers have been deposited, with each successive layer having alternating high and low doping levels. The FIG. 5 structure is formed by first depositing a second capacitor plate polysilicon layer 32 (polysilicon 2, with a thickness between about 500Å and about 1500Å). The secondary polysilicon layer is also doped by implantation of arsenic ions, but the dose of arsenic ions 32' is implanted at an energy of about 60 keV, to a lower concentration of between about 1 E 19 atoms/cm$^3$ and about 5 E 20 atoms/cm$^3$. A third capacitor plate layer 34 of polysilicon (polysilicon 3, with a thickness between about 500Å and about 1500Å thick) is blanket deposited to cover the previous, comparatively lightly doped, polysilicon 2 layer. Arsenic ions are implanted with a high dopant concentration between about 5 E 15 ions/cm$^2$ and about 5 E 16 ions/cm$^2$ at an energy of about 60 keV, yielding polysilicon with a comparatively high doping concentration of between about 5 E 20 atoms/cm$^3$ and about 5 E 21 atoms/cm$^3$. A fourth layer 36 of polysilicon (polysilicon 4, with a thickness between about 500Å and about 1500Å) is deposited. Doping of the fourth polysilicon layer by ion implantation follows, with arsenic (As) ions are implanted at an energy of about 60 keV, with a lower concentration between about 1 E 14 ions/cm$^2$ and about 1 E 15 ions/cm$^2$, yielding polysilicon with a low doping concentration of between about 1 E 19 atoms/cm$^3$ and about 1 E 20 atoms/cm$^2$. Most preferably, no annealing steps are performed to activate the different implantations made into the different polysilicon layers until after the stack is completed and after the etching steps described below.

The objective of this process is to build a series of stacked layers 30, 32, 34 and 36 of doped polysilicon with alternating relatively high and relatively low doping levels. The relatively high doping levels in layers 30 and 34 favor isotropic etching and the relatively low doping levels in layers 32 and 36 inhibit isotropic etching, respectively. By using this alternating layer design, the fin structures of a DRAM capacitor can be created by use of isotropic plasma etching of the layers 30 and 34 with higher doping levels while the more lightly doped layers 32 and 36 are etched to a much smaller extent.

Figure 6:
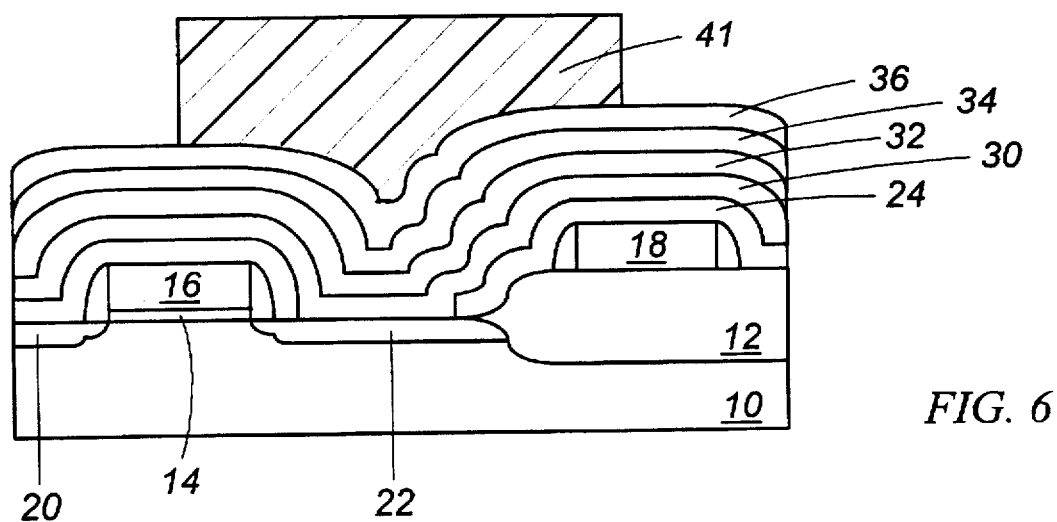
FIG. 6 shows the device of FIG. 5 partially covered by a resist mask which defines the edges of the capacitor electrode.
Figure 7:
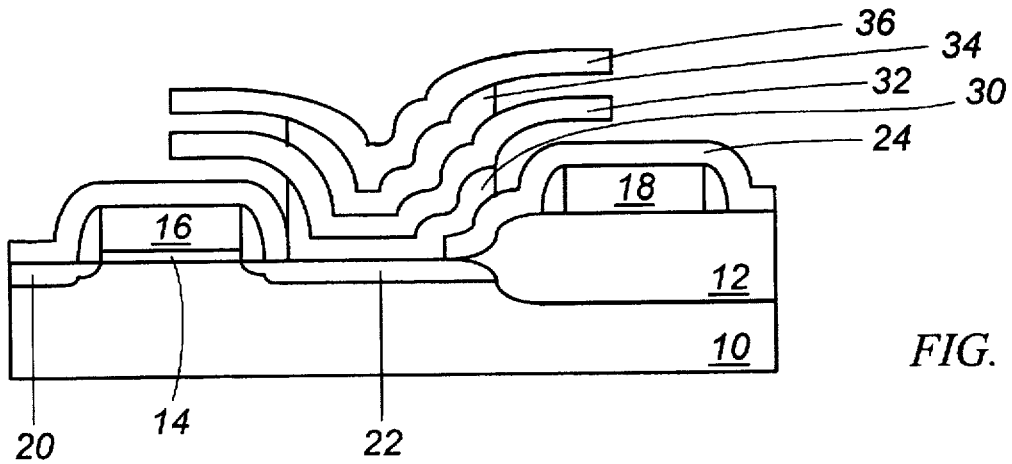
FIG. 7 shows the device of FIG. 6 after a preferred etching process through the series of differently doped polysilicon layers.

Referring to FIG. 6, the device of FIG. 5 is shown partially covered by a resist layer 41. Resist layer 41 is provided on the top of the polysilicon layers centered over the contact via 28 and extending over the surface of the top polysilicon layer 36 above the gate electrode 16 and above the electrode 18 over the field oxide region 12. FIG. 7 shows the device of FIG. 6 after an etching process and with the photoresist mask 41 removed. With the special design of the series of different doping polysilicon layers, the polysilicon capacitor fin layers 30, 32, 34, 36 (polysilicon 1-4) shown were etched where exposed by the mask 41 using plasma etching both vertically as defined by the mask and horizontally where the edges of highly doped polysilicon layers are exposed to plasma. This plasma etching may be performed in a machine such as a plasma etcher like the P5000 plasma etcher of Applied Materials. The preferred etching recipes used in such a machine may be:

M.E. (main etching): 70 sccm $Cl_2$, 80 mTorr;

O.E. (overetching): 70 sccm $Cl_2$, 80 mTorr; and

Flush: 35 sccm $Cl_2$, 70 sccm $SF_6$, 220 mTorr.

The relatively highly doped polysilicon is extremely sensitive to the plasma etchant and accordingly those layers are etched isotropically inward along their edges, so that significant lateral etching occurs for the highly doped layers under these conditions. The relatively low doping polysilicon is relatively resistant (inert) to the plasma, and is not significantly etched if ions are not striking its surface. Where, as here, a mask is present to protect the polysilicon stack from electrostatically accelerated ions, relatively few of the chlorine ions at the surface of the polysilicon will have sufficient energy to etch the lightly doped polysilicon, while a comparatively large number of chlorine ions will be able to etch the highly doped polysilicon. Thus, plasma etching is used to build a fin structure directly by selectively etching portions of a polysilicon structure, instead of using wet etching to remove sacrificial structure including polysilicon and dummy spacer layers of a material such as silicon nitride.

Figure 8:
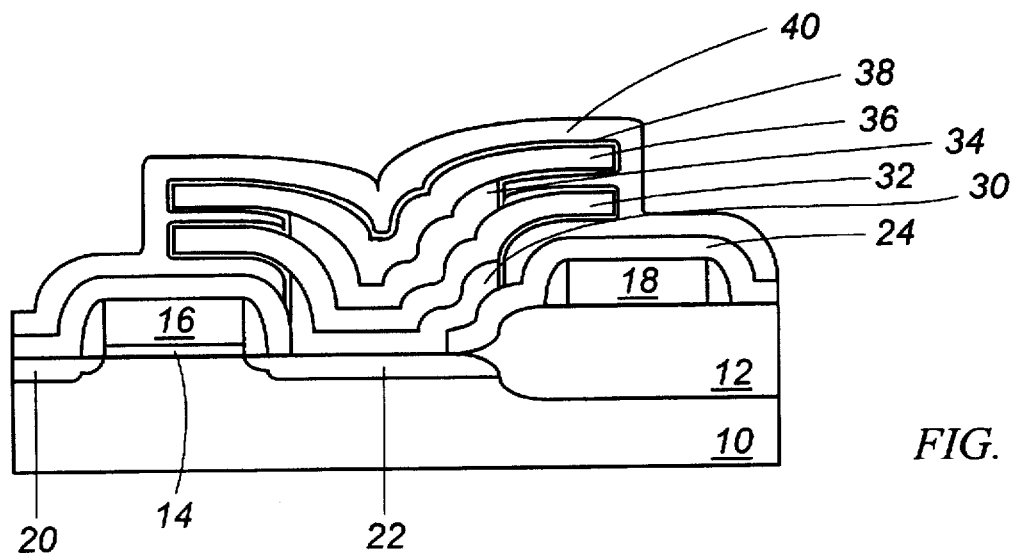
FIG. 8 shows the device of FIG. 7 after deposition of a thin, blanket, dielectric film layer on the surface of the lower capacitor electrode and the deposition of a polyoxide layer.

Referring to FIG. 8, the device of FIG. 7 is shown after a thin, blanket, dielectric film layer 38 (e.g. oxide/nitride/oxide or "ONO", or tantalum pentoxide, "$Ta_2O_5$") is provided on the surface of doped polysilicon layer 36 and on the other exposed surfaces of the device, including oxide layer 24. Layer 38 has a thickness of between about 40Å and about 100Å thick. Preferably, the dielectric film layer is significantly thinner than the separation between the fins of the lower capacitor electrode. This allows a subsequent, conformal deposition of a conductive material to extend between adjacent ones of the fins, providing increased surface area and capacitance for the DRAM capacitor. For example, a blanket polysilicon (polysilicon 5) layer 40 is deposited over the surface of ONO layer 38 by LPCVD over and extending between capacitor fins to serve as a top plate electrode of the capacitor. Layer 40 is deposited to a thickness between about 1000Å and about 3000Å, and may be doped in situ, by diffusion or by ion implantation followed by a sufficient anneal to allow ions to diffuse uniformly throughout the portions of the top electrode extending between the fins. Ion implantation may consist of a dose of arsenic (As) ions to a relatively low dosage of between about 1 E 15 ions/$cm^2$ and about 5 E 15 ions/$cm^2$ applied at an energy of about 40 keV, yielding polysilicon with a low doping concentration of between about 5 E 19 atoms/$cm^3$ and about 2 E 20 atoms/$cm^3$.

Figure 9:
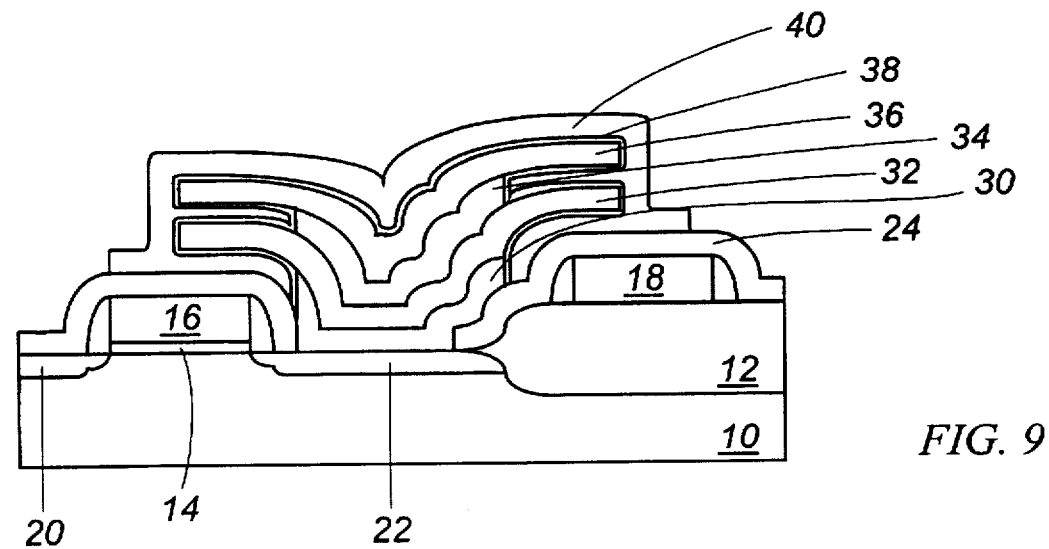
FIG. 9 shows the device of FIG. 8 after the top of the plate electrode (polysilicon 5) layer has been patterned.
Figure 10:
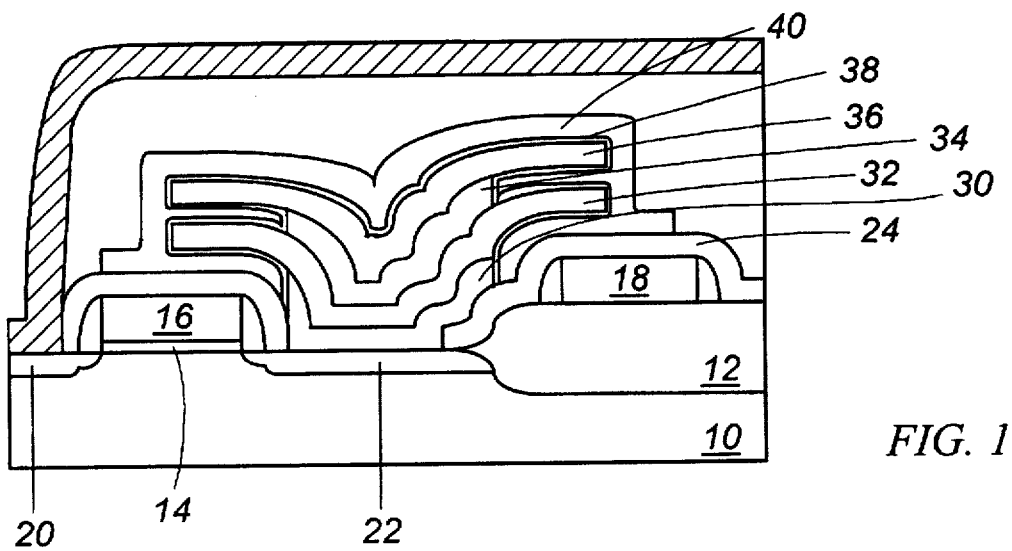
FIG. 10 shows the result of back-end process steps including deposition of a BPSG layer, heating to flow the BPSG layer, masking and etching the BPSG layer etc. to expose the surface of source regions to form an exposed contact surface thereon, as well as other conventional processes.

FIG. 9 shows the device of FIG. 8 after the top plate electrode (polysilicon 5) layer 40 has been patterned under conventional photolithography and etching conditions. Referring to FIG. 10, the back-end processing continues with steps including deposition of BPSG layer 44, heating the device 10 to cause BPSG layer 44 to flow, masking and etching BPSG layer 44 and layer 24 to expose the surface of source/drain regions 22 to form an exposed contact surface thereon, deposition of bit line metallization layer 46 extending down to contact source/drain region 22. Note that BPSG layer 44 separates the bit line 46 from the top capacitor plate 40. Passivation follows.

The process illustrated herein is extendable to more sets of alternating stacked layers.

Figure 11:
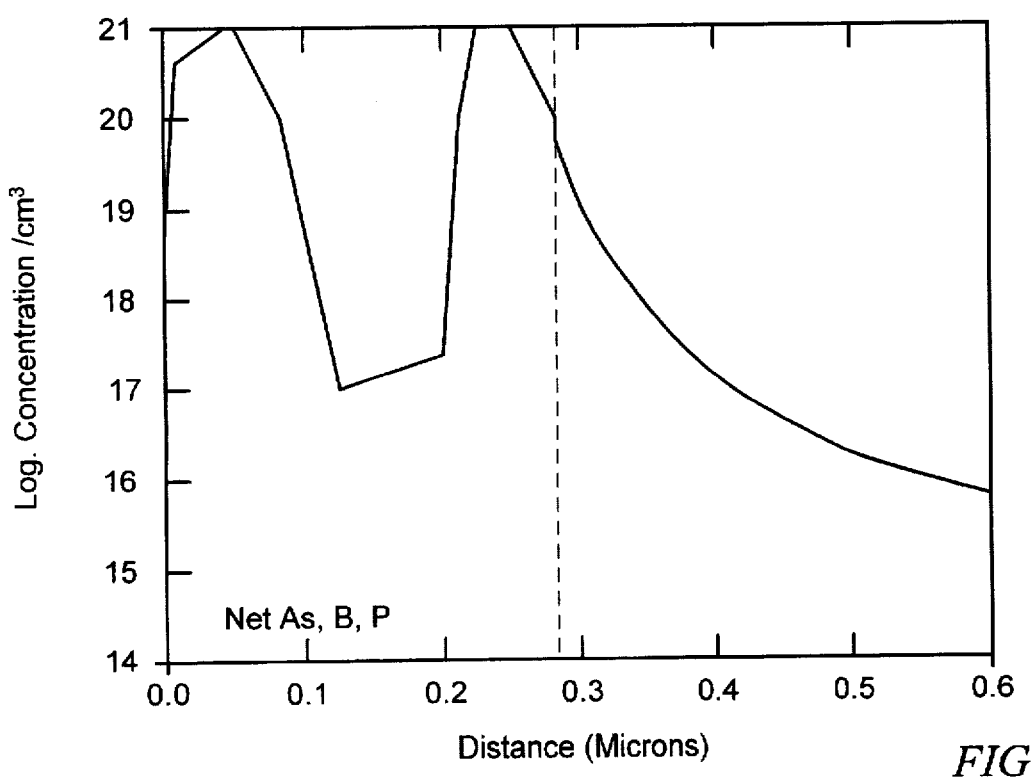
FIG. 11 shows the concentration of dopant in a polysilicon capacitor plate as a function of distance in microns for arsenic, boron or phosphorus dopant before activation by annealing.

FIG. 11 shows the concentration of dopant in a polysilicon capacitor plate as a function of distance in microns for arsenic, boron or phosphorus dopant before activation or annealing for a structure consisting of layers formed with the following parameters:

| Thickness Angstroms | Dopant | Energy keV | Dose ions/$cm^2$ |
|---|---|---|---|
| 800 | As | 50 | 5E15 |
| 2000 | As | 50 | 5E15 |

Figure 12:
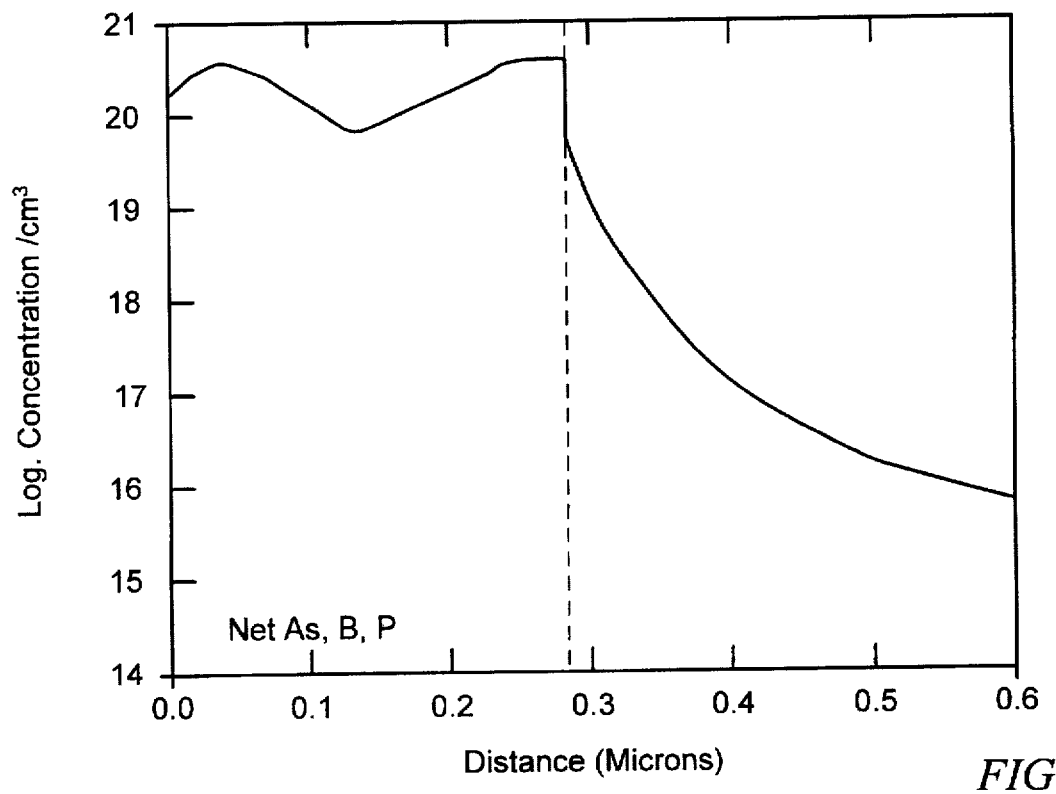
FIG. 12 shows the concentration of dopant in a polysilicon capacitor plate as a function of distance in microns for arsenic, boron or phosphorus dopant after activation by annealing.

FIG. 12 shows the concentration of dopant in a polysilicon capacitor plate as a function of distance in microns for arsenic, boron or phosphorus dopant after activation (900° C. annealing) for the structure illustrated in FIG. 11.

Figure 13:
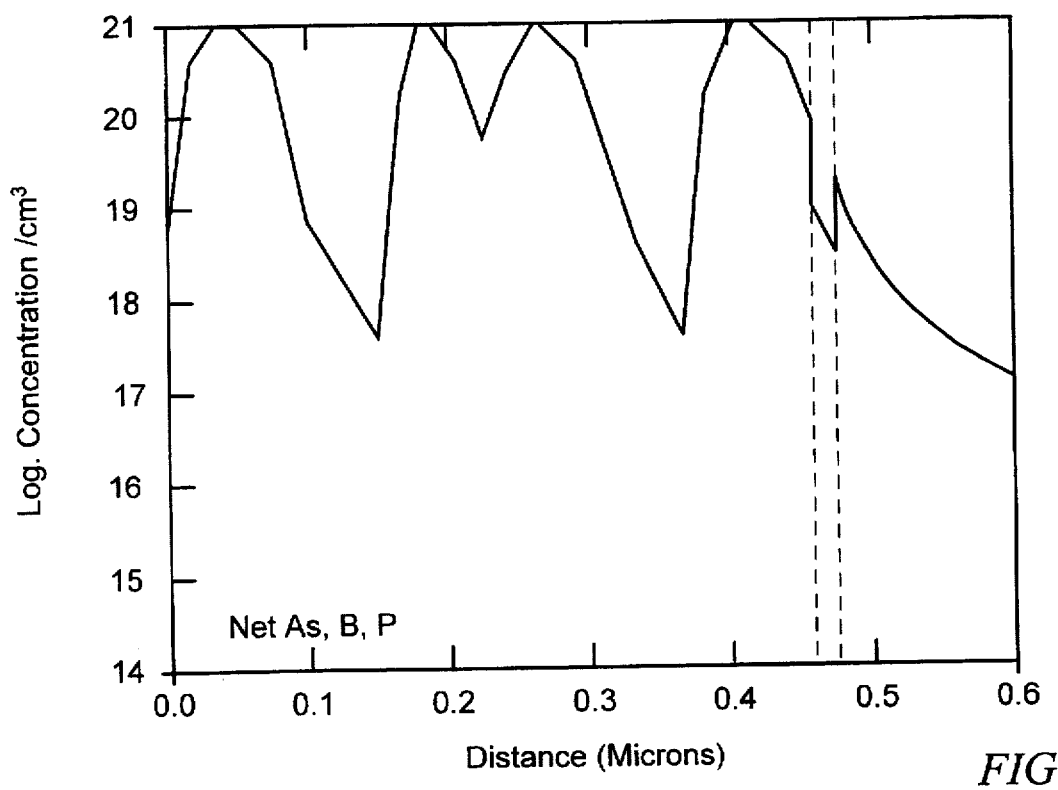
FIG. 13 shows the concentration of dopant in a polysilicon capacitor plate as a function of distance in microns for arsenic, boron or phosphorus dopant before activation annealing.

FIG. 13 shows the concentration of dopant in a polysilicon capacitor plate as a function of distance in microns for arsenic, boron or phosphorus dopant before activation 900° C. or annealing for a structure consisting of layers formed with the following parameters:

| Thickness Angstroms | Dopant | Energy keV | Dose ions/$cm^2$ |
|---|---|---|---|
| 800 | As | 50 | 5E15 |
| 2000 | As | 50 | 5E15 |
| 800 | As | 50 | 5E15 |
| 2000 | As | 50 | 5E15 |

Figure 14:
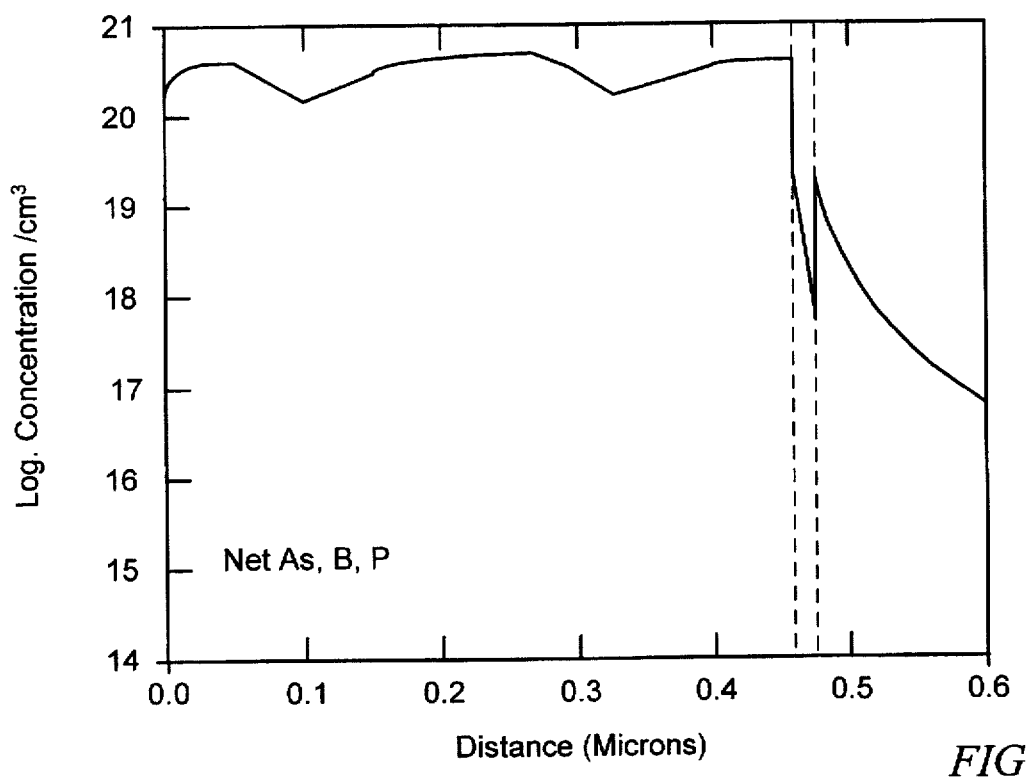
FIG. 14 shows the concentration of dopant in a polysilicon capacitor plate as a function of distance in micros for arsenic, boron or phosphorus dopant after activation by annealing.

FIG. 14 shows the concentration of dopant in a polysilicon capacitor plate as a function of distance in microns for arsenic, boron or phosphorus dopant after activation 900° C. annealing for the original doping profile illustrated in FIG. 13.

Figure 15:
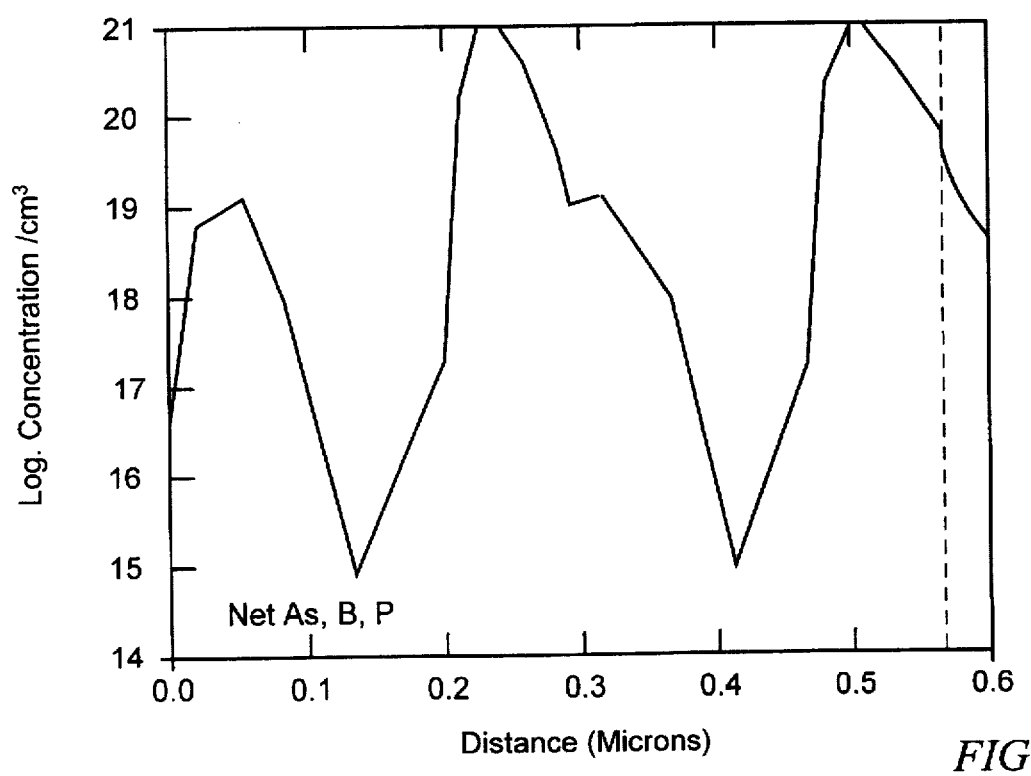
FIG. 15 shows the concentration of dopant in a polysilicon capacitor plate as a function of distance in microns for arsenic, boron or phosphorus dopant before activation by annealing.

FIG. 15 shows the concentration of dopant in a polysilicon capacitor plate as a function of distance in microns for arsenic, boron or phosphorus dopant before activation for a structure consisting of layers formed with the following:

| Thickness Angstroms | Dopant | Energy keV | Dose ions/$cm^2$ |
|---|---|---|---|
| 800 | As | 50 | 5E15 |
| 2000 | As | 50 | 5E13 |
| 800 | As | 50 | 5E15 |
| 2000 | As | 50 | 5E13 |

Figure 16:
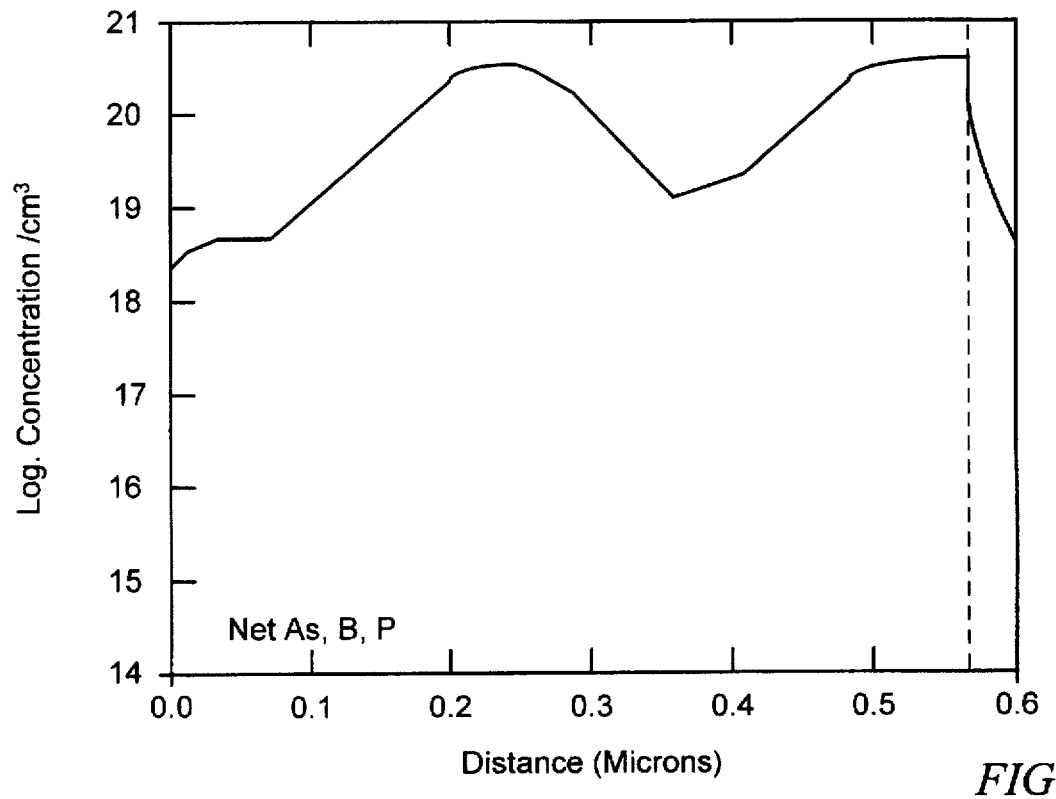
FIG. 16 shows the concentration of dopant in a polysilicon capacitor plate as a function in distance in microns for arsenic, boron or phosphorus dopant after activation by annealing.

FIG. 16 shows the concentration of dopant in a polysilicon capacitor plate as a function of distance in microns for arsenic, boron or phosphorus dopant after activation 900° C. annealing for a structure having the doping profile illustrated in FIG. 15.

Figure 17:
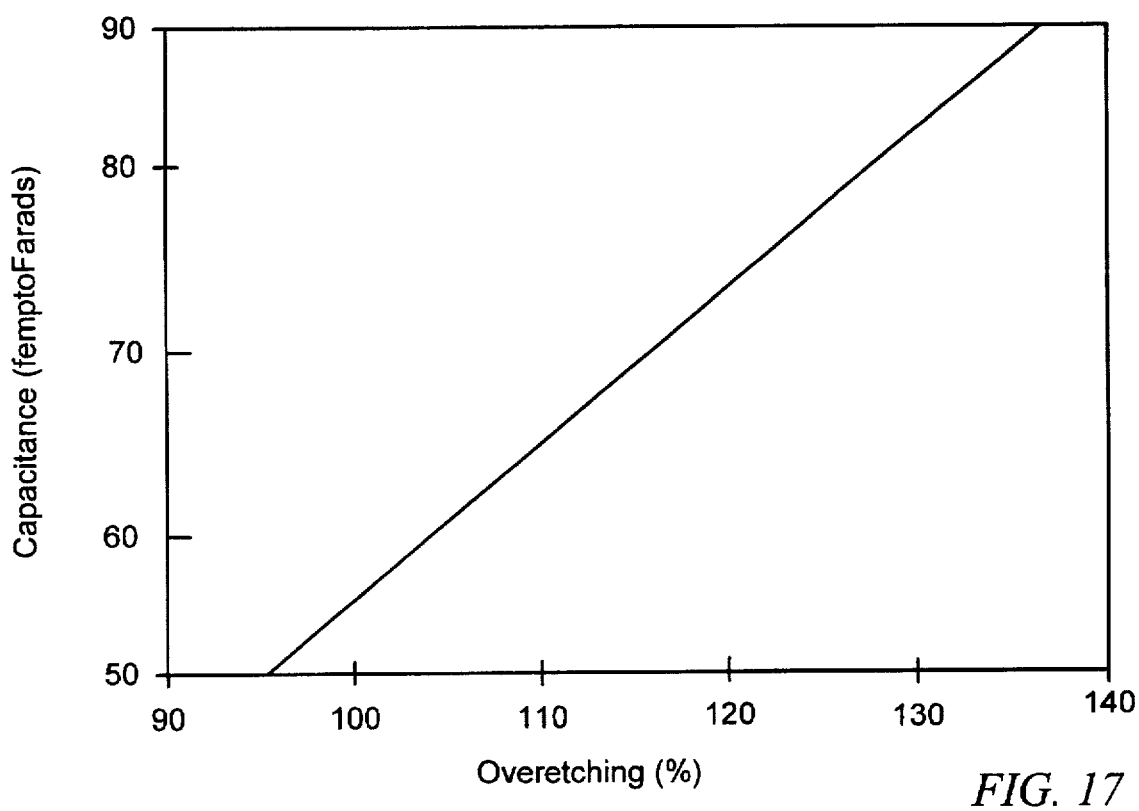
FIG. 17 shows the capacitance of a structure in accordance with this invention as a function of overetching percent.

The charts and FIGS. 11–16 show concentration profiles before and after activation, illustrating that appropriately uniform polysilicon doping profiles are achieved for the layered polysilicon structures upon annealing. FIG. 17 shows the capacitance of structures in accordance with this invention as a function of overetching percent. The purpose of FIG. 17 is to let the reader understand that polysilicon isotropic etching is mainly dependent upon overetching time, instead of flushing time. Within reasonable ranges, more overetching produces higher capacitance.

While this invention has been described in terms of the above specific embodiments, those skilled in the art will recognize that the invention can be practiced with modifications within the spirit and scope of the appended claims, i.e., that changes can be made in form and detail, without departing from the spirit and scope of the invention. Accordingly all such changes come within the purview of the present invention and the invention encompasses the subject matter of claims which follow.

What is claimed:

1. A method for fabricating a dynamic random access memory having a capacitor, the method comprising:

forming field isolation regions on a surface of a semiconductor substrate defining device areas for fabrication of field effect devices having gate structures and source/drain structures;

forming a gate dielectric layer on the substrate on the device areas;

depositing a first layer of polysilicon on the field isolation regions and the device areas;

removing portions of the first polysilicon layer while leaving portions thereof for the gate structure over the device areas, and portions over the field isolation regions;

forming source/drain structures within the device areas associated with the gate structures;

forming a first insulating layer over the device and field isolation regions;

forming openings to the source/drain structures by etching through the first insulating layer;

depositing a first capacitor plate polysilicon layer over the device and field isolation regions and into contact with one of the source/drain structures and doping the first capacitor plate polysilicon layer to a relatively high level;

depositing a second capacitor plate polysilicon layer over the first capacitor plate polysilicon layer and doping the second capacitor plate polysilicon layer to a relatively low level;

depositing a third capacitor plate polysilicon layer over the second layer and doping the third capacitor plate polysilicon layer to a relatively high level;

depositing a fourth capacitor plate polysilicon layer over the third layer and doping the fourth capacitor plate polysilicon layer to a relatively low level;

etching to laterally pattern the first, second, third and fourth capacitor plate polysilicon layers; and selectively etching away portions of the capacitor plate layers doped to the relatively high level removing the capacitor plate layers doped to the relatively high level from between capacitor plate layers doped to a relatively low level to create fins of the second and fourth capacitor plate polysilicon layers.

2. The method of claim 1, wherein the selectivity of etching the capacitor plate layers doped to a relatively high level versus the capacitor plate layers doped to a relatively low level is greater than about 5 to 10.

3. The method of claim 1, further comprising the step of forming a capacitor dielectric layer over the capacitor plate layers, and depositing an additional polysilicon layer as the top plate electrode, and patterning the additional polysilicon layer and the dielectric layer to complete said capacitor.

4. The method of claim 1, wherein the first polysilicon capacitor plate layer is doped with an impurity concentration of between about 5 E 20 to 5 E 21 atoms/cm$^3$.

5. The method of claim 4, wherein the second polysilicon capacitor plate layer is doped with an impurity concentration of between about 1 E 19 to 1 E 20 atoms/cm$^3$.

6. The method of claim 5, wherein the first and second capacitor plate layers are annealed after the step of selectively etching.

7. The method of claim 1, wherein the capacitor plate layer etching is performed in a three step process of main etching, overetching and flushing with parameters as follows:

M. E. (main etching): 70 sccm $Cl_2$, 80 mTorr;

O. E. (overetching): 70 sccm $Cl_2$, 80 mTorr; and

Flush: 35 sccm $Cl_2$, 70 sccm $SF_6$, 220 mTorr.

8. The method of claim 1, wherein the step of selectively etching is performed prior to annealing the polysilicon capacitor plate layers.

9. A method for fabricating a dynamic random access memory having a capacitor, the method comprising:

providing an array of memory transistors, each of the memory transistors having a gate structure and source/drain regions adjacent the gate structure;

forming a first insulating layer over the array of memory transistors;

forming openings to ones of the source/drain regions of the memory transistors by etching through the first insulating layer;

depositing a first capacitor plate polysilicon layer over the substrate into contact with the ones of the source/drain structures or with a layer of conductive material on the ones of the source/drain regions, and doping the first capacitor plate polysilicon layer to a relatively high level;

depositing a second capacitor plate polysilicon layer over the first capacitor plate polysilicon layer and doping the second capacitor plate polysilicon layer to a relatively low level;

etching to laterally define the first and second capacitor plate polysilicon layers; and selectively etching away portions of the capacitor plate layers doped to the relatively high level, removing the capacitor plate layers doped to the relatively high level from between capacitor plate layers doped to a relatively low level to create fins.

10. The method of claim 9, wherein the step of selectively etching is plasma process.

11. The method of claim 9, wherein the steps of etching and selectively etching proceeds simultaneously through anisotropic and isotropic components of a capacitor etch process.

12. The method of claim 11, wherein the capacitor etch process is plasma etching.

13. The method of claim 11, wherein the capacitor etch process is accomplished through an etchant consisting essentially of chlorine ions.

* * * * *